United States Patent
Sakata

(10) Patent No.: US 10,249,279 B1
(45) Date of Patent: Apr. 2, 2019

(54) D/A CONVERTER, ELECTRONIC MUSICAL INSTRUMENT, INFORMATION PROCESSING DEVICE AND D/A CONVERSION METHOD

(71) Applicant: CASIO COMPUTER CO., LTD., Shibuya-ku, Tokyo (JP)

(72) Inventor: Goro Sakata, Hamura (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 0 days.

(21) Appl. No.: 16/124,609

(22) Filed: Sep. 7, 2018

(30) Foreign Application Priority Data

Sep. 22, 2017 (JP) ................................ 2017-182591

(51) Int. Cl.
*G10H 5/00* (2006.01)
*H03M 3/00* (2006.01)
*H03F 3/181* (2006.01)

(52) U.S. Cl.
CPC ............ *G10H 5/002* (2013.01); *H03M 3/506* (2013.01); *H03F 3/181* (2013.01)

(58) Field of Classification Search
CPC ......... G10H 5/002; H03M 3/506; H03F 3/181
USPC .................................................... 84/600–602
See application file for complete search history.

(56) References Cited

U.S. PATENT DOCUMENTS

| | | | | |
|---|---|---|---|---|
| 4,704,600 A * | 11/1987 | Uchimura | ............ | H03M 3/418 341/122 |
| 4,851,841 A * | 7/1989 | Sooch | ................... | H03M 3/488 341/143 |
| 5,065,157 A * | 11/1991 | Ribner | .................... | H03M 3/32 341/143 |
| 5,068,661 A * | 11/1991 | Kaneaki | ................ | H03M 3/418 341/143 |
| 5,103,229 A * | 4/1992 | Ribner | .................. | H03M 3/414 341/143 |
| 5,124,703 A * | 6/1992 | Kaneaki | ............. | H03M 7/3022 341/143 |
| 5,550,544 A * | 8/1996 | Sakiyama | ............ | H03M 3/424 341/144 |
| 5,654,711 A * | 8/1997 | Fujimori | ............... | H03M 3/414 341/143 |
| 6,313,774 B1 * | 11/2001 | Zarubinsky | ........... | H03M 3/412 341/143 |

(Continued)

FOREIGN PATENT DOCUMENTS

| | | |
|---|---|---|
| JP | H10173526 A | 6/1998 |
| JP | 2008035027 A | 2/2008 |

(Continued)

*Primary Examiner* — David Warren
(74) *Attorney, Agent, or Firm* — Holtz, Holtz & Volek PC

(57) ABSTRACT

A digital-to-analog converter performs a ΔΣ computation process to start the ΔΣ computation based upon the second clock signal with respect to the digital data of music sound if the ΔΣ computation is not under execution when the control signal is outputted by the signal output process, a control process to inhibit the ΔΣ computation based upon the second clock signal from being started with respect to the digital data of music sound until the ΔΣ computation is not under execution when the ΔΣ computation is under execution, and an output process to convert a computation result of the ΔΣ computation process into an analog signal and output the analog signal.

8 Claims, 15 Drawing Sheets

(56) References Cited

U.S. PATENT DOCUMENTS

| | | | | |
|---|---|---|---|---|
| 6,577,258 B2* | 6/2003 | Ruha | H03M 3/392 | 341/143 |
| 6,795,005 B2* | 9/2004 | Hochschild | H03M 7/3015 | 341/143 |
| 6,954,161 B2* | 10/2005 | Inukai | H03M 3/442 | 341/143 |
| 7,084,797 B2* | 8/2006 | Yokoyama | H03M 3/418 | 341/143 |
| 7,142,144 B1* | 11/2006 | Farooqi | H03M 3/344 | 341/143 |
| 7,439,893 B2 | 10/2008 | Inukai et al. | | |
| 7,924,194 B2* | 4/2011 | Kumar | H03M 3/368 | 341/143 |
| 7,936,293 B2* | 5/2011 | Hamashita | H03M 3/42 | 341/143 |
| 8,067,974 B2* | 11/2011 | Lenhard | H03K 7/04 | 327/337 |
| 8,130,127 B1* | 3/2012 | Tsang | H03M 3/322 | 341/143 |
| 8,552,895 B2* | 10/2013 | Nezuka | H03M 3/464 | 341/136 |
| 2006/0071835 A1* | 4/2006 | Inukai | H03M 3/492 | 341/143 |
| 2006/0164274 A1* | 7/2006 | Nakakita | H03M 3/394 | 341/143 |
| 2009/0278721 A1* | 11/2009 | Hamashita | H03M 3/412 | 341/143 |
| 2011/0267210 A1* | 11/2011 | Risbo | H03M 7/3006 | 341/110 |
| 2014/0240154 A1* | 8/2014 | Kim | H03M 3/32 | 341/143 |
| 2017/0359078 A1* | 12/2017 | Heubi | H03M 1/08 | |
| 2018/0014123 A1* | 1/2018 | Shajaan | H04R 3/02 | |
| 2018/0048326 A1* | 2/2018 | Chiu | H03M 3/322 | |
| 2018/0115320 A1* | 4/2018 | Sharma | A61B 5/04284 | |

FOREIGN PATENT DOCUMENTS

| | | |
|---|---|---|
| JP | 4092652 B2 | 5/2008 |
| JP | 2009239700 A | 10/2009 |

* cited by examiner

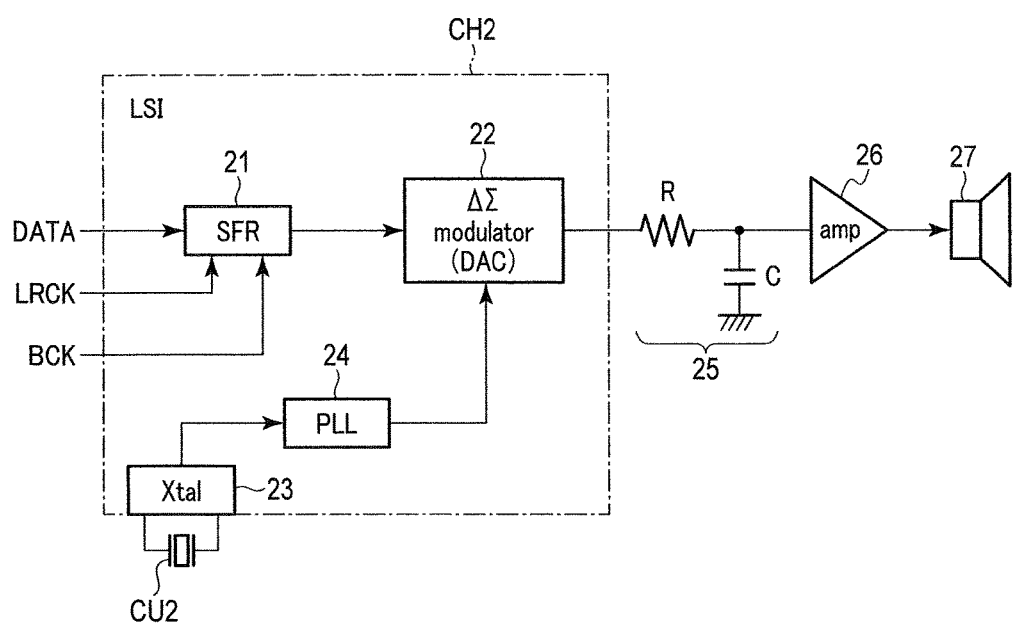
F I G. 2

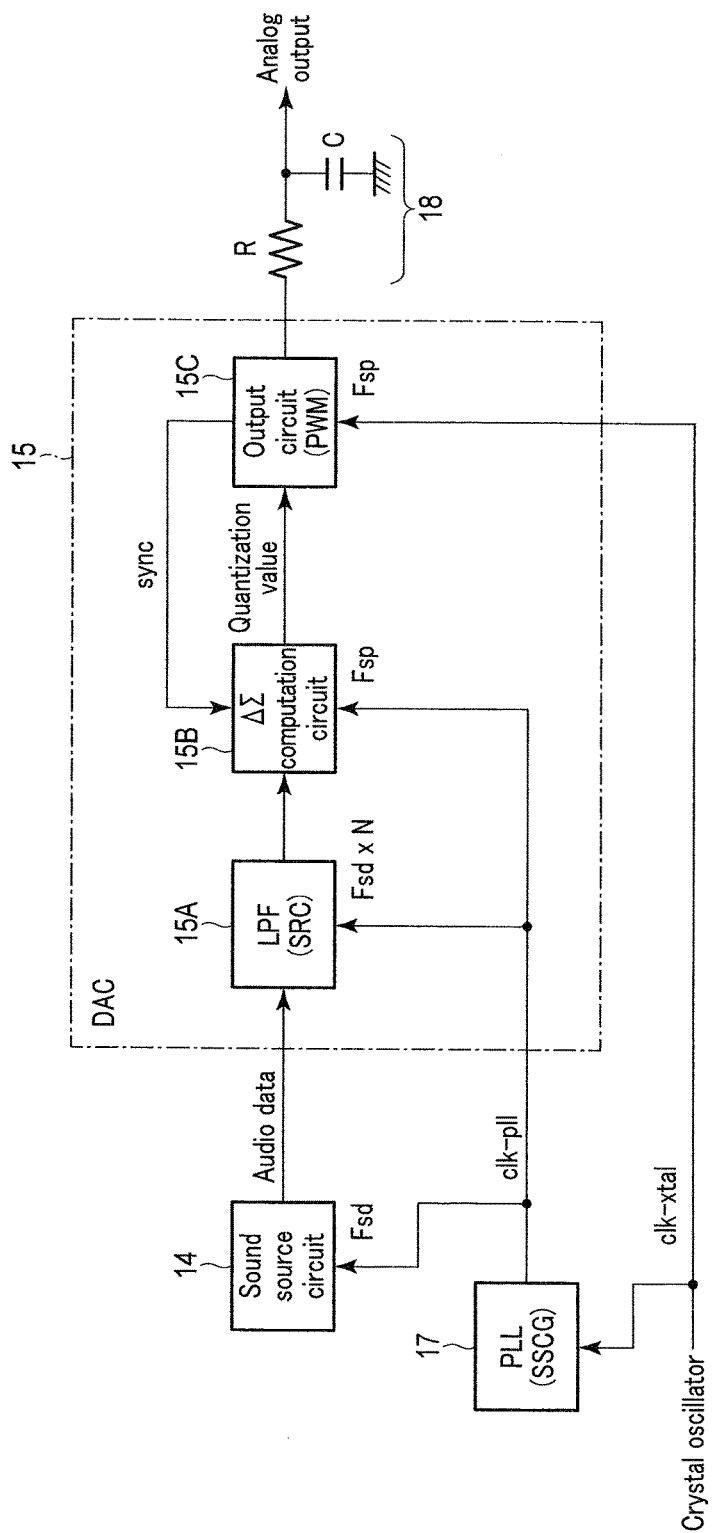
F I G. 4

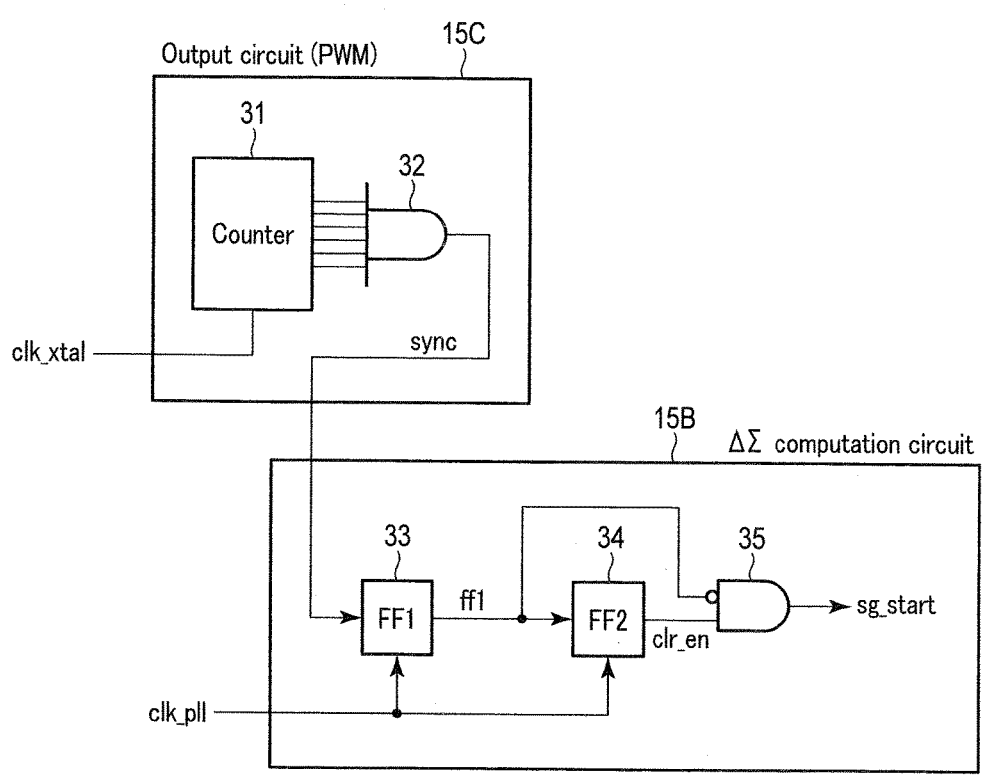
F I G. 5

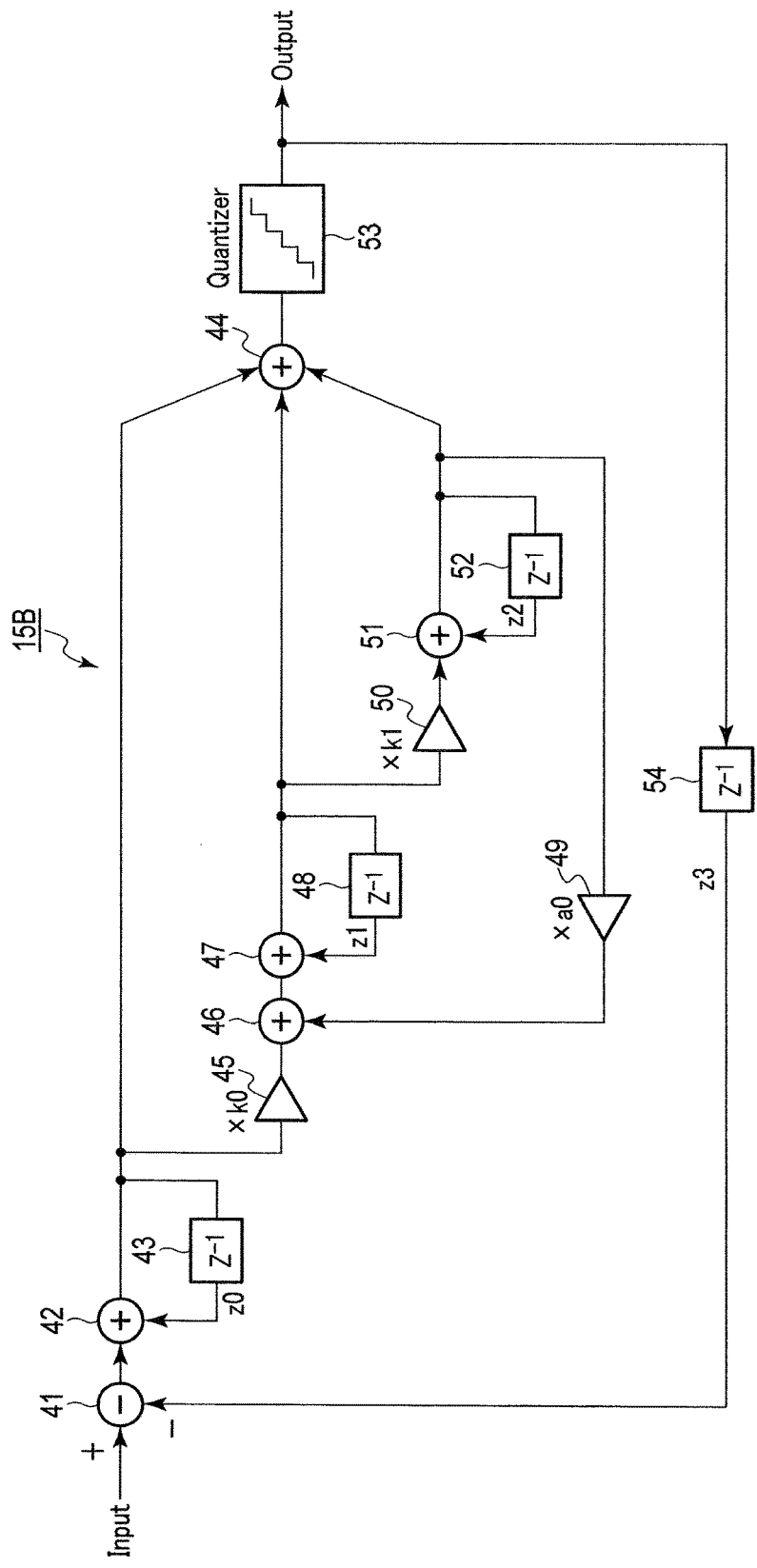
F I G. 6

| mcnt | ΔΣ computation process |
|---|---|
| 16 | sync wait |
| 0 | AC <= z3 + IN |
| 1 | Z0 <= AC + Z0 |
| 2 | AC <= Z2 x a0 |
| 3 | AC <= Z0 x k0+ AC |
| 4 | Z1 <= AC + Z1 |
| 5 | AC <= Z1 x k1 |
| 6 | Z2 = Z2 + AC |
| 7 | AC <= Z0 + Z1 + Z2 |
| 8 | Quantizer <= AC |
| 9 | Z3 <= Output of quantizer |
| 10 | nop |
| 11 | nop |
| 12 | nop |
| 13 | nop |
| 14 | nop |
| 15 | nop |
| 16 | sync wait |
| 16 | sync wait |
| 16 | sync wait |
| 16 | sync wait |
| 16 | sync wait |

FIG. 9

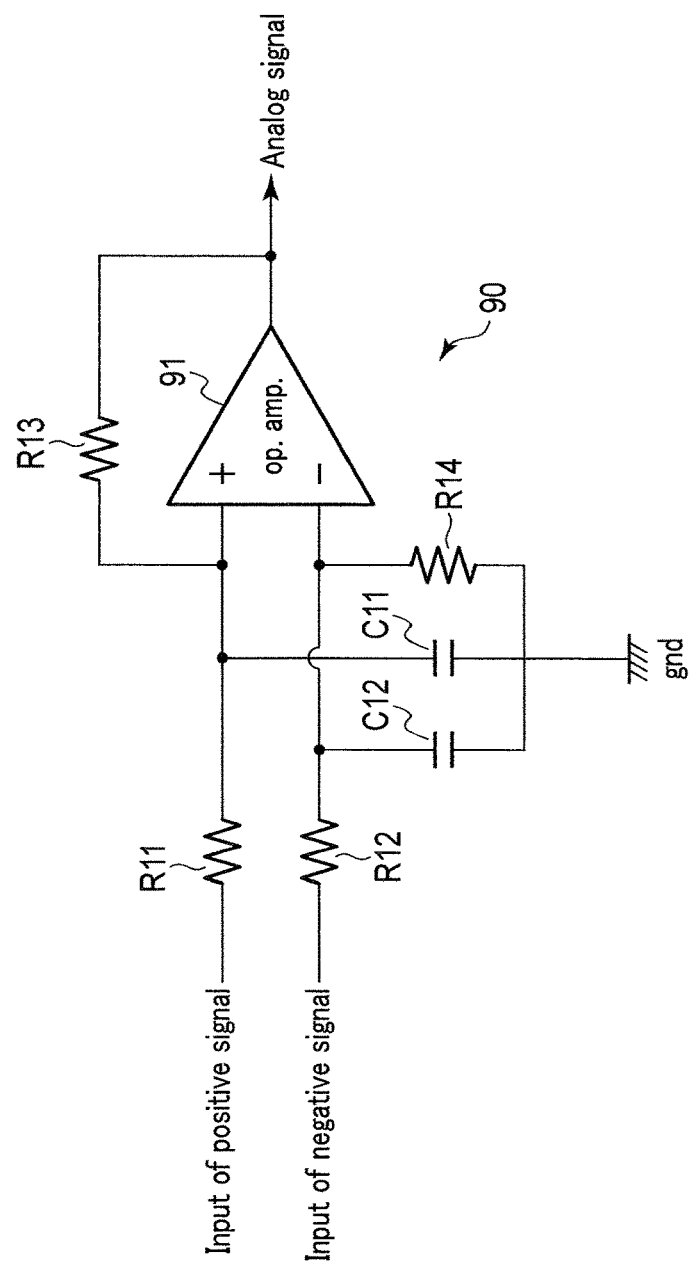
F I G. 11

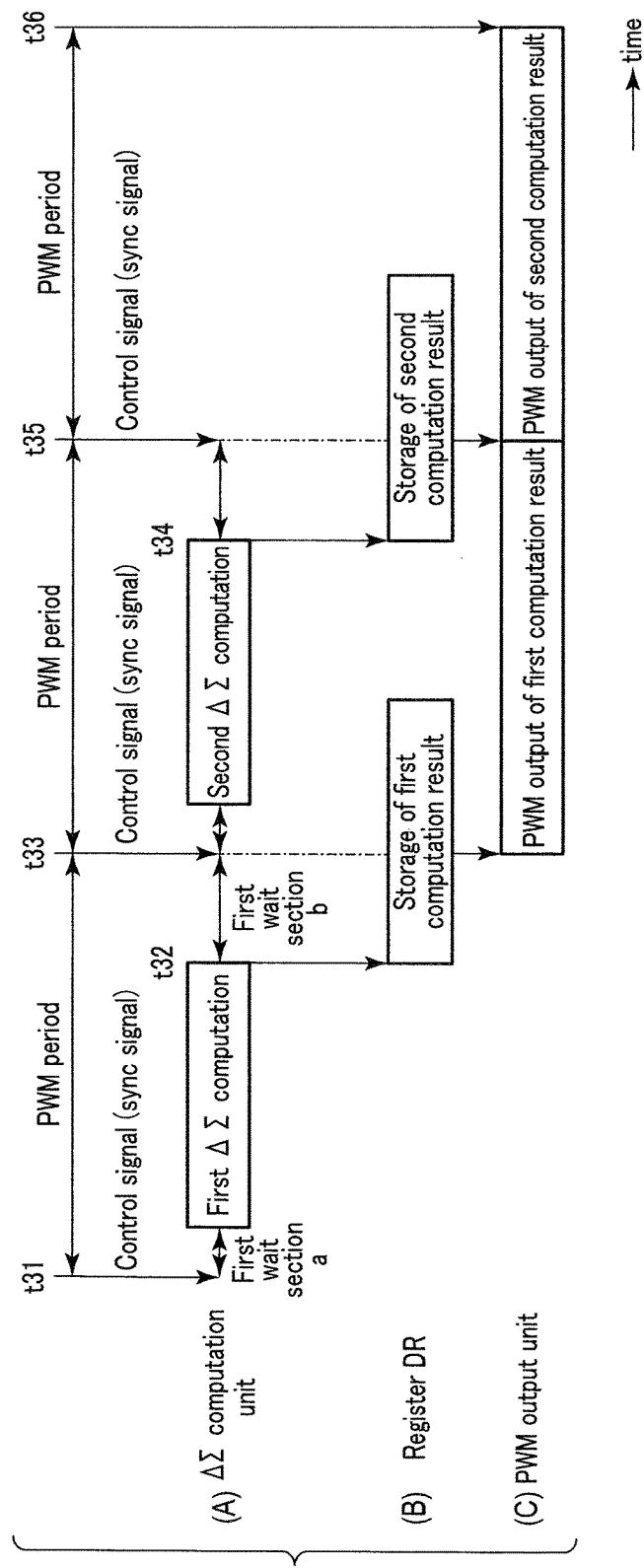
F I G. 14

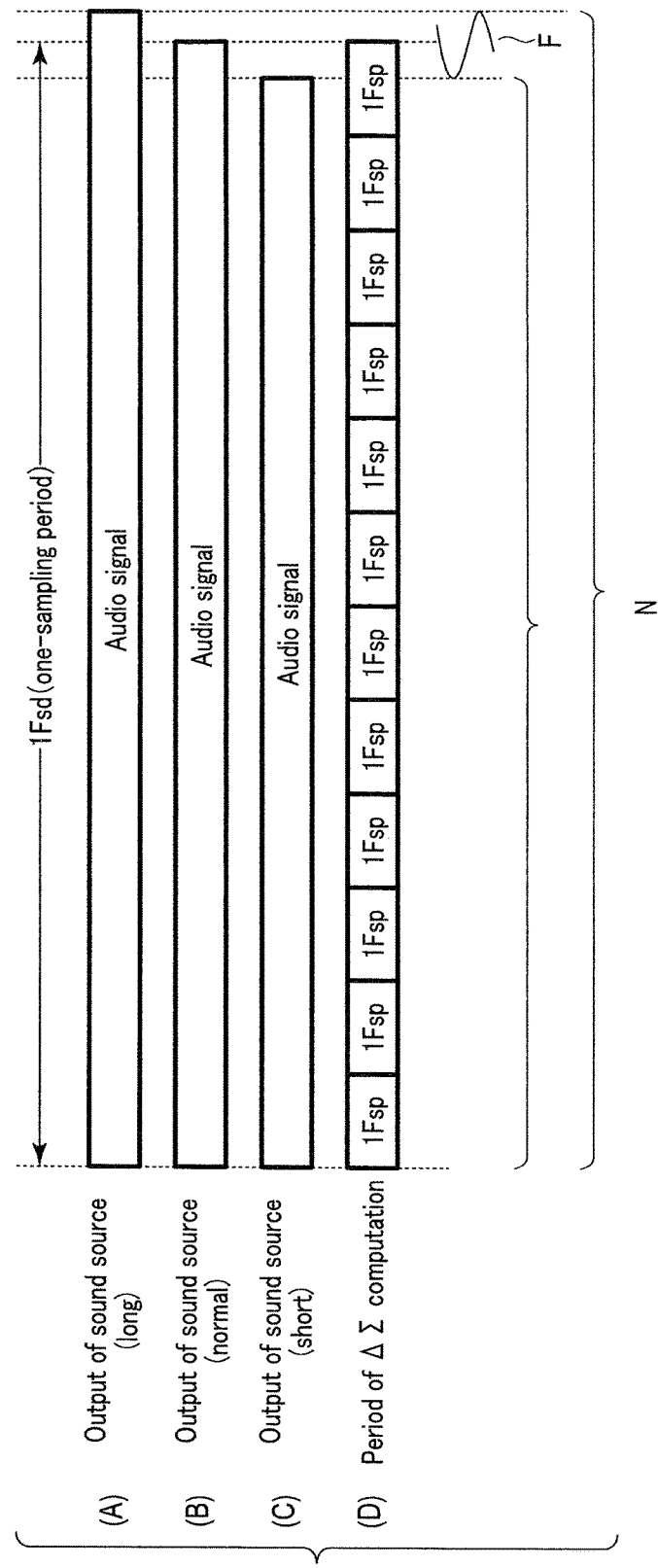
F I G. 15

D/A CONVERTER, ELECTRONIC MUSICAL INSTRUMENT, INFORMATION PROCESSING DEVICE AND D/A CONVERSION METHOD

CROSS-REFERENCE TO RELATED APPLICATIONS

This application is based upon and claims the benefit of priority from Japanese Patent Application No. 2017-182591, filed Sep. 22, 2017, the entire contents of which are incorporated herein by reference.

BACKGROUND OF THE INVENTION

1. Field of the Invention

The present invention relates to a D/A converter, an electronic musical instrument, an information processing device and a D/A conversion method.

2. Description of the Related Art

D/A converter technologies capable of equipping a host system with a D/A converter and avoiding the influence of jitters without complicating the configuration of the D/A converter are proposed (see Patent Literature 1, for example).

Patent Literature 1: Jpn. Pat. Appln. KOKAI Publication No. 2009-239700

As disclosed in Patent Literature 1, the signal output from a $\Delta\Sigma$ device based on the clock of a phase-locked loop (PLL) with a spread spectrum clock generator (SSCG) always varies in its changing point. The signal is thus latched as it is in response to a high-precision signal of a crystal oscillator, which is a stationary periodic signal, or it cannot be caused to pass a logic gate.

A method of absorbing fluctuations of audio data due to a periodic variation in the clock of the SSCG by a FIFO memory or the like is devised. However, unless there is an integral-multiple relationship between the center frequency of clocks of the PLL with an SSCG and the clock frequency of the crystal oscillator, it is likely that data will leak from the FIFO memory and data will be lost therefrom.

In a PLL with an SSCG of a modulation type and a down spread type with the highest frequency at the center, it is difficult to set the center frequency of clocks of the PLL at an integral multiple of the clock frequency of the crystal oscillator. The PLL thus requires the modulation depth and high-precision multiplication number.

The present invention has been made in consideration of the above situation and its advantage is to allow a process to be performed in whatever frequency combination of a first clock as a reference and a second clock whose frequency is higher than that of the first clock.

SUMMARY OF THE INVENTION

According to one aspect of the present invention, there is provided a digital-to-analog converter that converts digital data of music sound represented by an input digital signal into an analog signal, the digital-to-analog converter being configured to perform: a signal output process to output a control signal for each a second period, the second period being equal to an integral multiple of a first period in a first clock signal; a count process to count a second clock signal whose clock frequency is higher than that of the first clock signal, and store a count value; a determination process to determine whether $\Delta\Sigma$ computation is under execution with respect to the digital data of music sound, in accordance with the count value stored by the count process; a $\Delta\Sigma$ computation process to start the $\Delta\Sigma$ computation based upon the second clock signal with respect to the digital data of music sound if it is determined in the determination process that the $\Delta\Sigma$ computation is not under execution when the control signal is outputted by the signal output process; a control process to inhibit the $\Delta\Sigma$ computation based upon the second clock signal from being started with respect to the digital data of music sound until it is determined in the determination process that the $\Delta\Sigma$ computation is not under execution after it is determined in the determination process that the $\Delta\Sigma$ computation is under execution; and an output process to convert a computation result of the $\Delta\Sigma$ computation process into an analog signal and output the analog signal.

BRIEF DESCRIPTION OF THE SEVERAL VIEWS OF THE DRAWING

The present invention will be more understood with reference to the following detailed descriptions with the accompanying drawings.

FIG. 2 is a block diagram showing a configuration of a modification to the D/A converter according to the embodiment of the present invention;

FIG. 4 is a block diagram chiefly showing a configuration of a $\Delta\Sigma$ modulator in the electronic musical instrument according to the embodiment;

FIG. 5 is a diagram showing a configuration of a circuit provided in a $\Delta\Sigma$ computation circuit and an output (PWM) circuit to generate various timing signals in the electronic musical instrument according to the embodiment;

FIG. 6 is a diagram showing a circuit configuration of the $\Delta\Sigma$ computation circuit in the electronic musical instrument according to the embodiment;

FIG. 9 is a table showing the computation process performed by the hardware circuit shown in FIG. 8 in the electronic musical instrument according to the embodiment;

FIG. 11 is a diagram showing a configuration of a balanced analog circuit that converts a PWM signal to an analog signal in the electronic musical instrument according to the embodiment;

FIG. 14 is a timing chart showing the timing of operations continuing from the ΔΣ computation to the output of the PWM signal in the electronic musical instrument according to the embodiment; and FIG. 15 is a timing chart showing variations of a one-sampling period Fsd of digital audio data output from a sound source circuit at a stage precedent to the ΔΣ modulator in the electronic musical instrument according to the embodiment.

DETAILED DESCRIPTION OF THE INVENTION

One embodiment of the present invention will be described in detail below with reference to the drawings.

Figure 1:
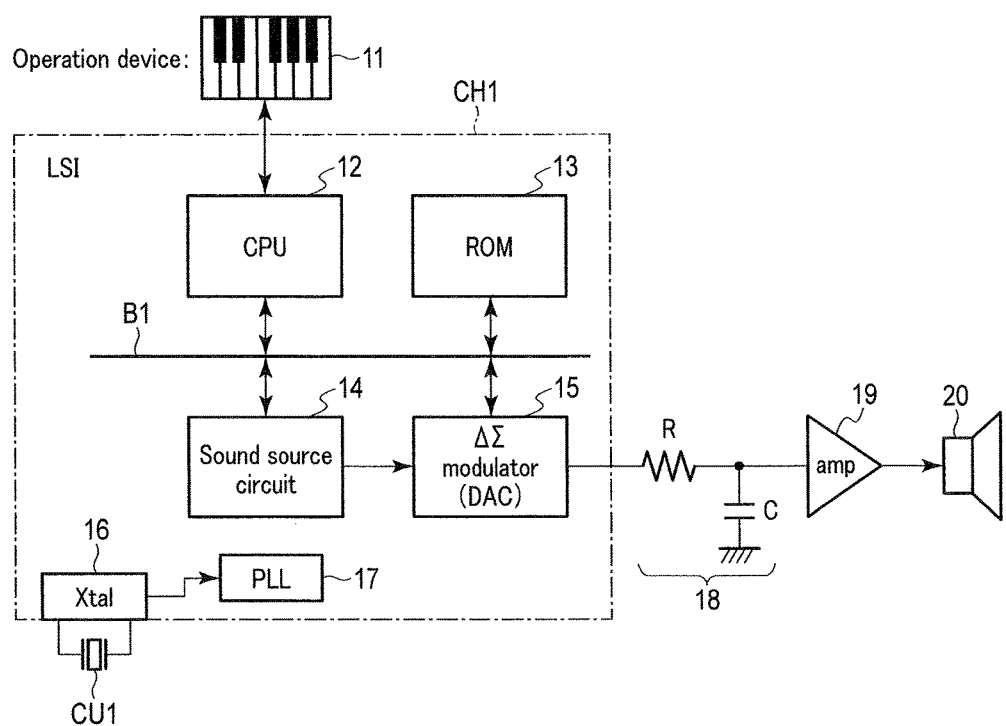
FIG. 1 is a block diagram showing the overall configuration of an electronic musical instrument with a D/A converter according to one embodiment of the present invention.

FIG. 1 is a block diagram showing the overall configuration of an electronic musical instrument with a D/A converter (DAC) according to the embodiment. As shown in FIG. 1, an operation device 11 configured by a performance operation device such as a keyboard and the like generates an operation signal and supplies it to a CPU 12 of an LSI chip CH1. The CPU 12 is connected to a ROM 13 that stores, e.g., operation programs and template data for the electronic musical instrument, a sound source circuit 14 that generates digital audio data corresponding to an operation performed by the operation device 11, and a ΔΣ modulator 15 via a bus B1 in the LSI chip CH1.

The LSI chip CH1 includes a crystal oscillator (Xtal) 16 and a PLL 17. The crystal oscillator 16 applies a fixed voltage to a crystal resonator CU1 external to the LSI chip CH1 to oscillate a first clock clk-xtal serving as a reference and supply it to the PLL 17 and each circuit in the LSI chip CH1.

Upon receipt of the first clock clk-xtal, the PLL 17 oscillates a second clock clk-pll whose frequency is higher than that of the first clock clk-xtal and supplies it to each circuit in the LSI chip CH1.

Upon receipt of the operation signal from the operation device 11, the CPU 12 sends parameters such as pitch and volume to the sound source circuit 14. Accordingly, the sound source circuit 14 outputs their corresponding digital audio data to the ΔΣ modulator 15.

The ΔΣ modulator 15 is a main circuit of the D/A converter (DAC) according to the present embodiment. The ΔΣ modulator 15 generates a PWM signal corresponding to digital audio data input from the sound source circuit 14 and outputs it to a low-pass filter 18 outside the LSI chip CH1.

When the digital audio data input from the sound source circuit 14 is, for example, 32 bits, the ΔΣ modulator 15 performs a ΔΣ computation process of converting the digital audio data into 3-bit digital data to output a five-stage PWM signal. To do so, 15 periods (15 steps) of the second clock clk-pll are required.

The low-pass filter 18 is included in the D/A converter (DAC) of the present embodiment. Using a series RC circuit as shown in FIG. 1, the low-pass filter 18 converts the PWM signal into an analog audio signal and outputs it to an amplifier (amp) 19. It is desirable to use a differential amplifier as the amplifier 19 as will be described later.

The amplifier 19 amplifies the analog audio signal with an appropriate amplification factor. In response to the amplified analog audio signal, a speaker 20 is driven to emit sound.

FIG. 2 is a block diagram showing a configuration of a modification to the D/A converter according to the embodiment of the present invention without using the electronic musical instrument shown in FIG. 1. In this modification, serial audio data DATA, a clock LRCK to distinguish between R and L channels of an audio signal, and a bit clock BCK are supplied to a shift register (SFR) 21 in an LSI chip CH2 in conformity with, e.g., the Inter-IC Sound (I2S) standard. The audio data held in the shift register 21 is read in a ΔΣ modulator 22 as parallel data in accordance with the clocks.

The LSI chip CH2 includes a crystal oscillator (Xtal) 23 and a PLL 24. The crystal oscillator 23 applies a fixed voltage to a crystal resonator CU2 external to the LSI chip CH2 to oscillate a first clock clk-xtal serving as a reference and supply it to the PLL 24 and each circuit in the LSI chip CH2.

Upon receipt of the clock clk-xtal, the PLL 24 oscillates a second clock clk-pll whose frequency is higher than that of the first clock and supplies it to the ΔΣ modulator 22.

The ΔΣ modulator 22 is a main circuit of the D/A converter (DAC) according to the present embodiment. The ΔΣ modulator 22 generates a PWM signal corresponding to digital audio data read out of the shift register 21 and outputs it to a low-pass filter 25 outside the LSI chip CH2.

The low-pass filter 25 is included in the D/A converter (DAC) of the present embodiment. Using a series RC circuit as shown in FIG. 2, for example, the low-pass filter 25 converts the PWM signal into an analog audio signal and outputs it to an amplifier (amp) 26. It is desirable to use a differential amplifier as the amplifier 26 as will be described later.

The amplifier 26 amplifies the analog audio signal with an appropriate amplification factor. In response to the amplified analog audio signal, a speaker 27 is driven to emit sound.

Figure 3:
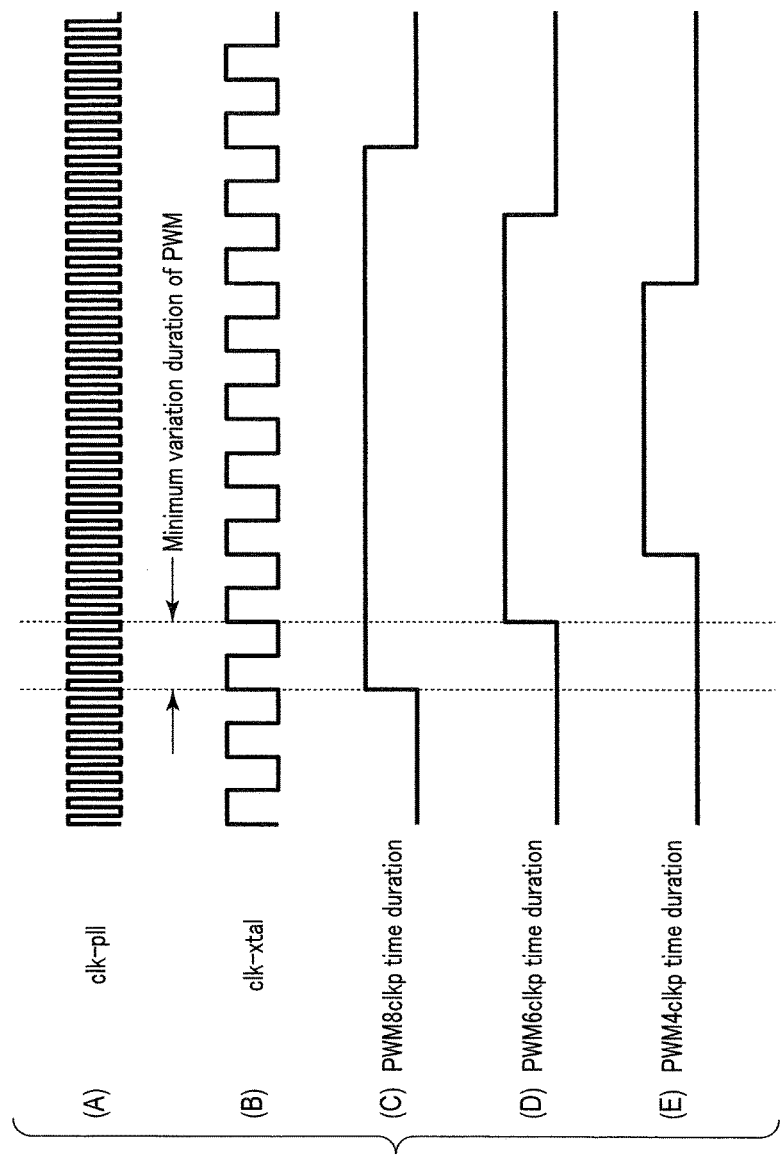
FIG. 3 is a timing chart showing an example of a waveform of each clock and PWM signal in the electronic musical instrument according to the embodiment.

FIG. 3 is a timing chart illustrating the relationship among the first clock clk-xtal ((B) in FIG. 3), the second clock clk-pll ((A) in FIG. 3) and the PWM signal generated by the ΔΣ modulator 15 (22).

In FIG. 3, the frequency of the first clock clk-xtal is four times as high as that of the second clock clk-pll.

When the PWM signal generated by performing ΔΣ computation by the ΔΣ modulator 15 (22) using the second clock clk-pll, the frequency of the second clock clk-pll needs to be an integral multiple of that of the first clock clk-xtal.

The PWM signals generated from the ΔΣ modulator 15 (22) are exemplified in (C) to (E) in FIG. 3.

In FIG. 3, (C) indicates that the "H" section of the PWM signal corresponds to the duration of eight periods of the first clock clk-xtal.

Similarly, in FIG. 3, (D) indicates that the "H" section of the PWM signal correspond to the duration of six periods of the first clock clk-xtal and (E) indicates that the "H" section of the PWM signal correspond to the duration of four periods of the first clock clk-xtal.

As shown in FIG. 3, the PWM signal is outputted with its minimum variation duration as one period of the first clock clk-xtal at both the rising timing and falling timing.

FIG. 4 is a block diagram chiefly showing a configuration of the ΔΣ modulator 15.

The digital audio data output from the sound source circuit 14 is input to a low-pass filter (LPF) 15A of the ΔΣ modulator 15. The low-pass filter 15A operates at a frequency that is an M (M is an integer) multiple of the frequency Fsd of the input digital audio data based upon the second clock clk-pll from the PLL 17, and outputs the audio data to a ΔΣ computation circuit 15B.

The ΔΣ computation circuit 15B samples the outputs of the low-pass filter 15A at a frequency that is an N (N is a given number that varies dynamically) multiple of the frequency Fsd in accordance with the timing of a signal sync which is supplied from an output circuit 15C (described later) and synchronized with the period of the PWM signal.

The value of N may be a value that varies dynamically excluding an integer or driven by a clock of the spread spectrum clock generator (SSCG) used in the PLL 17. However, the value should fall within a range almost corresponding to the performance of noise shaping and a required frequency band and is usually set to 16 or more.

The ΔΣ computation circuit 15B performs the ΔΣ computation at high speed at a frequency Fsp corresponding to the first clock clk-xtal based upon the second clock clk-pll and supplies the output section 15C with a signal of a quantization value corresponding to the digital audio data.

The output section 15C generates a PWM signal corresponding to the quantization signal from the ΔΣ computation circuit 15B at a frequency Fsp corresponding to the first clock clk-xtal supplied from the crystal oscillator 16, and outputs the PWM signal to the low-pass filter 18 in the subsequent stage and outputs a signal sync to control the input timing for the ΔΣ computation circuit 15B.

FIG. 5 is a diagram showing a circuit provided in the ΔΣ computation circuit 15B and the output circuit 15C to generate various timing signals. The output circuit 15C includes a counter 31 and a multi-input AND circuit 32. The counter 31 counts the first clock clk-xtal and outputs the signal sync as the output of the multi-input AND circuit 32 when the bit level of each count value becomes high, or whenever the processing for each sampling starts.

The ΔΣ computation circuit 15B includes flip-flops (FF) 33 and 34 of two stages and an AND circuit 35. The first-stage flip-flop 33 is supplied with the signal sync from the output circuit 15C. The flip-flops 33 and 34 are both operated by the second clock clk-pll. The second-stage flip-flop 34 is supplied with a signal of shift output ff1 of the first-stage flip-flop 33. The signal is inverted and supplied to the AND circuit 35.

The AND circuit 35 is supplied with a signal clr_en of the shift output of the second-stage flip-flop 34. The logical OR output of the AND circuit 35 is used as a timing signal sg_start to start the ΔΣ computation (described later).

FIG. 6 is a diagram specifically showing a configuration of a computation circuit of the ΔΣ computation circuit 15B. As shown in FIG. 6, the ΔΣ computation circuit 15B includes a subtracter (−) 41, adders (+) 42, 44, 46, 47 and 51, delay devices (Z−1) 43, 48, 52 and 54, multipliers 45, 49 and 50 and a quantizer 53.

The digital audio data supplied from the low-pass filter 15A in the preceding stage is subtracted by the subtracter 41 by the output of the delay device 54 that delays the output of the quantizer 41, and a difference corresponding to the subtraction is supplied to the adder 42. The adder 42 adds to the difference an output z0 of the delay device 43 that delays its own output and supplies the sum to the delay device 43, adder 44 and multiplier 45.

The multiplier 45 multiplies the output of the adder 42 by coefficient k0 and supplies the product to the adder 46. The adder 46 adds the outputs of the multipliers 45 and 49 and supplies the sum to the adder 47.

The adder 47 adds the output of the adder 46 and the output z1 of the delay device 48 that delays its own output, and supplies the sum to the delay device 48, adder 44 and multiplier 50. The multiplier 50 multiplies the output of the adder 47 by coefficient k1 and supplies the product to the adder 51.

The adder 51 adds the output of the multiplier 50 and the output z2 of the delay device 52 that delays its own output, and supplies the sum to the delay device 52, adder 44 and multiplier 49. The multiplier 49 multiplies the output of the adder 51 by coefficient a0 and supplies the product to the adder 51.

The adder 44 adds the outputs of the adders 42, 47 and 51 and supplies the sum to the quantizer 53 to quantize the sum. Then, a signal output from the quantizer 53 is supplied to the output circuit 15C in the subsequent stage as the output of the ΔΣ computation circuit 15B and to the delay device 54. The delay device 54 delays the output of the quantizer 53 and supplies the delayed output z3 to the subtracter 41 as a subtrahend to feed back the input negatively.

If e is quantization noise, the characteristics of quantization noise e in output y of the quantizer 53 are given by the following equation.

$$e = \frac{(-1+z^{-1})(-1+2z^{-1}+a0 \times k1 \times z^{-1}-z^{-2})}{1-2 \times z^{-1}+k0 \times z^{-1}+a0 \times k1 \times z^{-1}+k0 \times k1 \times z^{-1}+z^{-2}+k0 \times z^{-1}}$$

Figure 7:
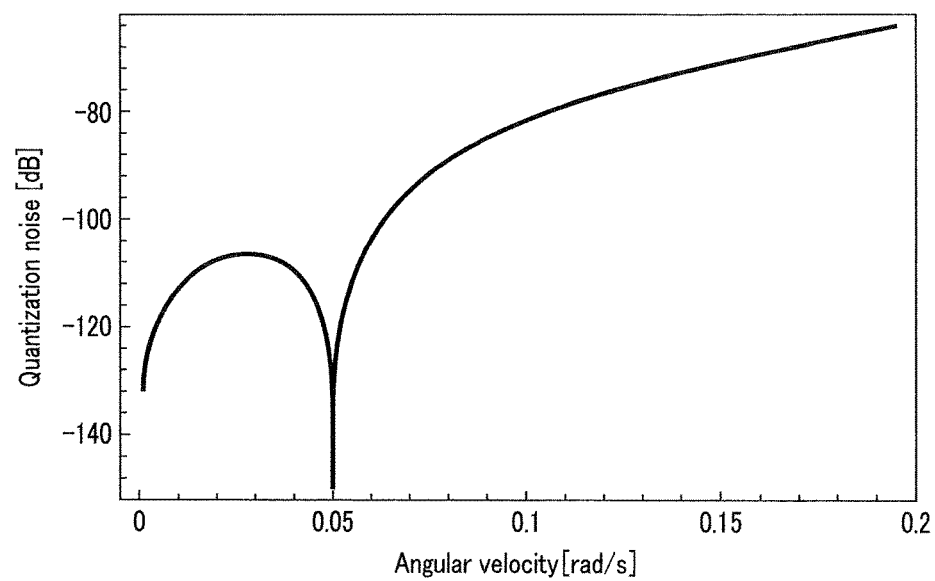
FIG. 7 is a graph showing noise shaping frequency characteristics in the electronic musical instrument according to the embodiment.

FIG. 7 is a graph showing noise shaping frequency characteristics shown by the graph of the quantization noise e given by the above equation. In FIG. 7, the horizontal axis represents angular velocity and the vertical axis represents a noise signal level (Quantization Noise) [dB]. If a required amount of noise shaving is −100 [dB], an audible band is a range corresponding to about 0.06 ($=\frac{1}{16}$) of the angular velocity.

In other words, the sampling rate Fsp of a noise shaper is required about sixteen times as high as the sampling frequency Fsd of the digital audio data.

Figure 8:
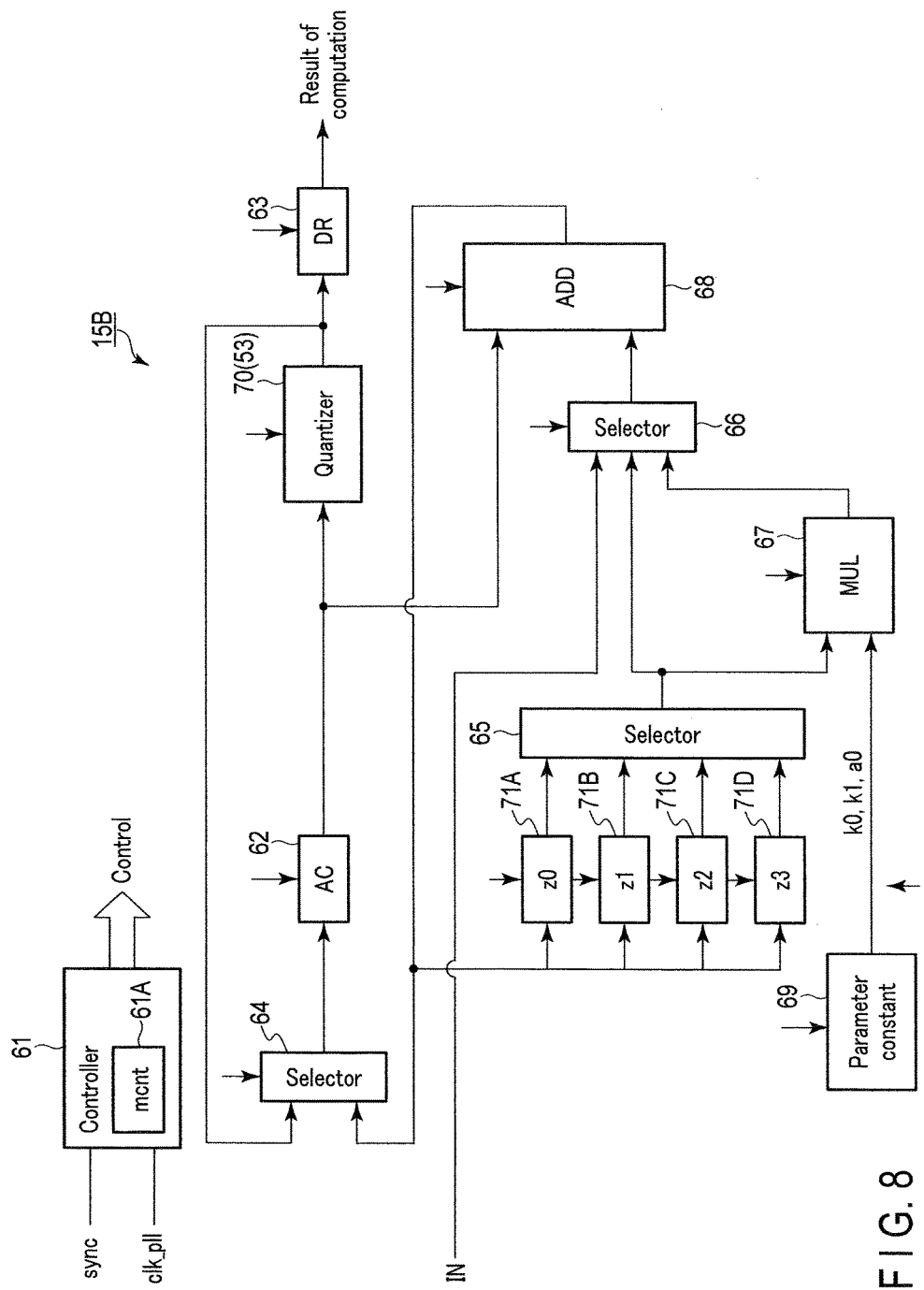
FIG. 8 is a block diagram showing a configuration of a hardware circuit that causes the $\Delta\Sigma$ computation circuit to perform a specific computation process in the electronic musical instrument according to the embodiment.

FIG. 8 is a block diagram showing a case where the computation process shown in FIG. 6 is performed by a specific hardware circuit.

The signal sync and second clock clk-pll shown in FIGS. 4 and 5 are input to a controller 61. The controller 61 includes an m counter (mcnt) 61A to count the clock clk-pll and performs the following control of each circuit. Specifically, the controller 61 latches and enables the register, selects a selector and selects a parameter.

The count value of the m counter 61A is reset by a signal clr_en generated by delaying the signal sync, and the second clock clk-pll is counted.

The ΔΣ computation circuit 15B includes registers 62 and 63, selectors 64-66, a multiplier (MUL) 67, an adder (ADD) 68, a parameter constant generator 69, a quantizer 70 and registers 71A-71D for delay.

The selector 66 receives digital audio data from the low-pass filter 15A in the preceding stage. The selector 66 also receives signals from the selector 65 and the multiplier 67 and supplies one value selected in accordance with the controller 61 to the adder 68.

The adder 68 receives a hold value of the register (AC) 62. The controller 61 controls the adder 68 to supply a sum, which is obtained by the controller 61, to the selector 64 and the registers (z0-z3) 71A-71D used in the delay devices 43, 48, 52 and 54 shown in FIG. 6.

The hold values of the registers 71A-71D are input to the selector 65. The controller 61 controls the selector 65 to select one of the hold values and supply the selected one to the selector 66 and the multiplier 67.

The multiplier 67 multiplies the output of the selector 65 by one of parameter constants k0, k1 and a0 that are generated from the parameter constant generator 69 and supplies the product to the selector 66.

The controller 61 controls the selector 64 to select one of the outputs of the adder 68 and the quantizer 70 (53) and hold it in the register (AC) 62. The hold value is read out of the register 62 and supplied to the quantizer 70 and the adder 68.

Then, the computation result of the ΔΣ computation circuit 15B is supplied to the selector 64 from the quantizer 70 and also held in the register (DR) 63. A value of the held result is read out of the register 63 and supplied to the output circuit 15C in the subsequent stage.

FIG. 9 shows the contents of the computation process performed by the hardware circuit shown in FIG. 8 in correspondence with the count values of the m counter 61A of the controller 61. The m counter 61A is a basic counter that controls the operation of the ΔΣ computation circuit 15B and takes count values of "0" to "16."

More specifically, the m counter 61A is reset to "0" in response to the signal sync from the output circuit 15C and then counts up one by one (+1) in response to the second clock clk-pll. When the m counter 61A counts up to the maximum value of "16," it holds the count value "16" until it is reset.

When the count value of the m counter 61A is "16," the m counter 61A stands by to perform a reset operation in response to the signal sync.

When the count value of the m counter 61A is "16," the ΔΣ computation can be executed for a second sample subsequent to a first sample to be input, or the ΔΣ computation is not under execution.

When the count value of the m counter 61A is "0" to "15," the ΔΣ computation cannot be executed for a second sample subsequent to a first sample to be input, or the ΔΣ computation is under execution. When the count value of the m counter 61A is "0" to "15," the m counter 61A is so controlled that it is not reset to "0" even though it receives the signal sync. Thus, the ΔΣ computation is not executed for the second sample when the count value of the m counter 61A is "0" to "15."

The ΔΣ modulator (DAC) 15 determines whether the ΔΣ computation can be executed for the subsequent sample in accordance with the count value of the m counter 61A. In other words, the ΔΣ modulator (DAC) 15 performs a process to determine whether the ΔΣ computation is under execution or not.

The contents of computation performed by the controller 61 in the ΔΣ computation circuit 15B and corresponding to the count values "0" to "15" of the m counter 61A will be described in brief.

0: When the m counter 61A is reset to "0" in response to the signal sync, the selector 65 selects the delayed value z3 held in the register 71D and the selector 66 selects a selection result of the selector 65 and input data from the low-pass filter 15A in sequence. The adder 68 adds the selection results, the selector 64 selects the sum thereof and the register 62 holds it.

1: The selector 65 selects the delayed value z0 held in the register 71A and the selector 66 selects a selection result of the selector 65. The adder 68 adds the selection result of the selector 66 and the value held in the register 62 and the register 71A holds the sum thereof.

2: The selector 65 selects the delayed value z2 held in the register 71C, the parameter constant generator 69 outputs a parameter constant a0 and the multiplier 67 multiplies these values together. The register 62 holds a product obtained by the multiplication through the selector 66, adder 68 and selector 64.

3: The selector 65 selects the delayed value z0 held in the register 71A, the parameter constant generator 69 outputs a parameter constant a0 and the multiplier 67 multiplies these values together. The register 66 selects a product obtained by the multiplication, reads the value out of the register 62 and supplies it to the adder 68. The adder 68 adds these two values and the register 62 holds the sum thereof again through the selector 64.

4: The selectors 65 and 66 select the delayed value z1 held in the register 71B and supply it to the adder 68. They also read a value out of the register 62 and supply it to the adder 68. The adder 68 adds these two values and the register 71B holds the sum thereof again.

5: The selector 65 selects the delayed value z1 held in the register 71B, the parameter constant generator 69 outputs a parameter constant k1 and the multiplier 67 multiplies these values together. The register 62 holds a product obtained by the multiplication through the selector 66, adder 68 and selector 64.

6: The selectors 65 and 66 select the delayed value z2 held in the register 71C and supply it to the adder 68. They also read a value out of the register 62 and supply it to the adder 68. The adder 68 adds these two values and the register 71C holds the sum thereof again.

7: The selectors 65 and 66 select the delayed values z0 to z2 in sequence from the registers 71A to 71C and supply them in serial to the adder 68. The adder 68 adds these three values and the register 62 holds the sum thereof through the selector 64.

8: A value is read out of the register 62 and supplied to the quantizer 70 for quantization. The quantizer 70 supplies its output to the output circuit 15C in the subsequent stage through the register 63.

9: The output of the quantizer 70 is held in the register 71D through the selector 64, register 62 and adder 68.

10-15: Stand by without doing anything.

The foregoing ΔΣ computation process is performed in synchronization with the signal sync generated for each PWM period (Fsp) and in accordance with the count value mcnt of the m counter 61A that performs a count operation in response to the second clock clk-pll.

The configuration of a hardware circuit of the output (PWM) circuit 15C located in a stage subsequent to the ΔΣ computation circuit 15B will be described specifically with reference to FIG. 10.

The output circuit 15C includes an n counter 81 that performs a count operation in response to the first clock clk-xtal, decoders 82, 83 and 85A to 85E that decode the count value of the n counter 81, a register (PR) 84, a selector 86 and flip-flops (DFF) 87 and 88.

The decoder 82 detects that the value of the n counter 81 is "0" to generate the signal sync. The decoder 83 detects that the value of the n counter 81 is "15" to output a latch enable signal LE to the register 84.

In response to the latch enable signal LE from the decoder 83, the register 84 latches a result of quantization output from the register (DR) 63 of the ΔΣ computation circuit 15B in the preceding stage and outputs the latched value to the selector 86.

The decoders 85A to 85E supplies the selector 86 with pulse signals whose pulse durations are 0%, 25%, 50%, 75% and 100% based upon the count value of the n counter 81.

The selector 86 selects one of the pulse signals output from the decoders 85A to 85E in response to a quantization signal generated from the register 84 to supply its forward-rotation signal to the flip-flop 87 and supply its reverse-rotation signal to the flip-flop 88.

The flip-flops 87 and 88 of two stages are provided to output a balanced signal. They latch the outputs of the selector 86 in response to the first clock clk-xtal and supply a positive signal and a negative signal.

Figure 10:
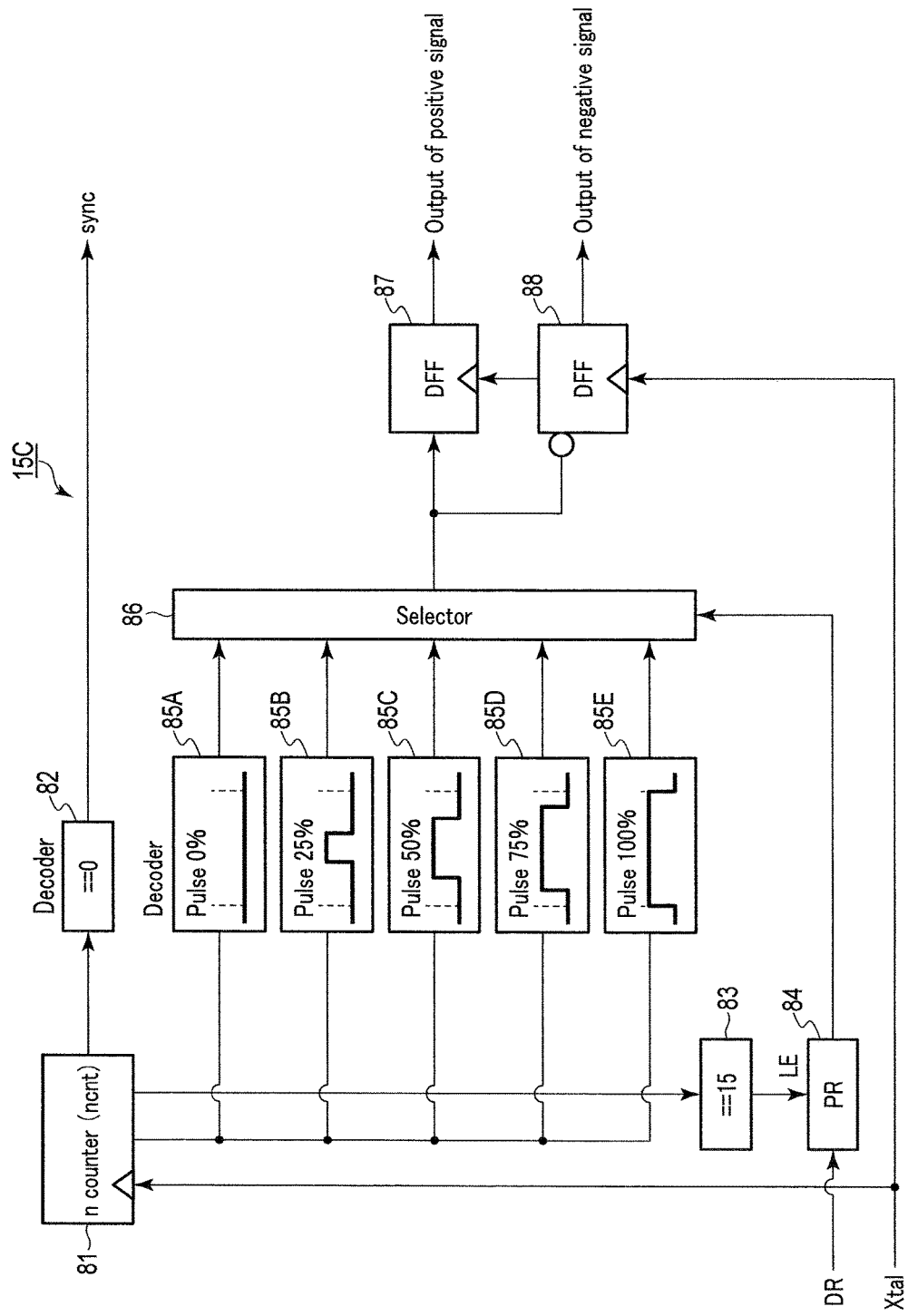
FIG. 10 is a block diagram showing a configuration of a hardware circuit that causes the output (PWM) circuit to perform a specific computation process in the electronic musical instrument according to the embodiment.

FIG. 11 is a diagram illustrating an analog-conversion circuit 90 that converts a balanced PWM signal as shown in FIG. 10 into an analog signal. The analog-conversion circuit 90 corresponds to the low-pass filter 18 and the amplifier 19 shown in FIG. 1.

As shown in FIG. 11, the positive signal output from the flip-flop 87 is supplied to the positive (+) input terminal of a differential amplifier (op. amp.) via a series RC circuit of a resistor R11 and a capacitor C11.

On the other hand, the negative signal output from the flip-flop 88 is supplied to the negative (−) input terminal of the differential amplifier via a series RC circuit of a resistor R12 and a capacitor C12.

A resistor R13 is connected between the output terminal and positive (+) input terminal of the differential amplifier 91. Positive feedback is thus applied to the differential amplifier 91. Then, for example, the speaker 20 shown in FIG. 1 emits sound as audio signal into which the output of the differential amplifier 91 is converted.

An operation of the foregoing embodiment will be described below.

Figure 12:
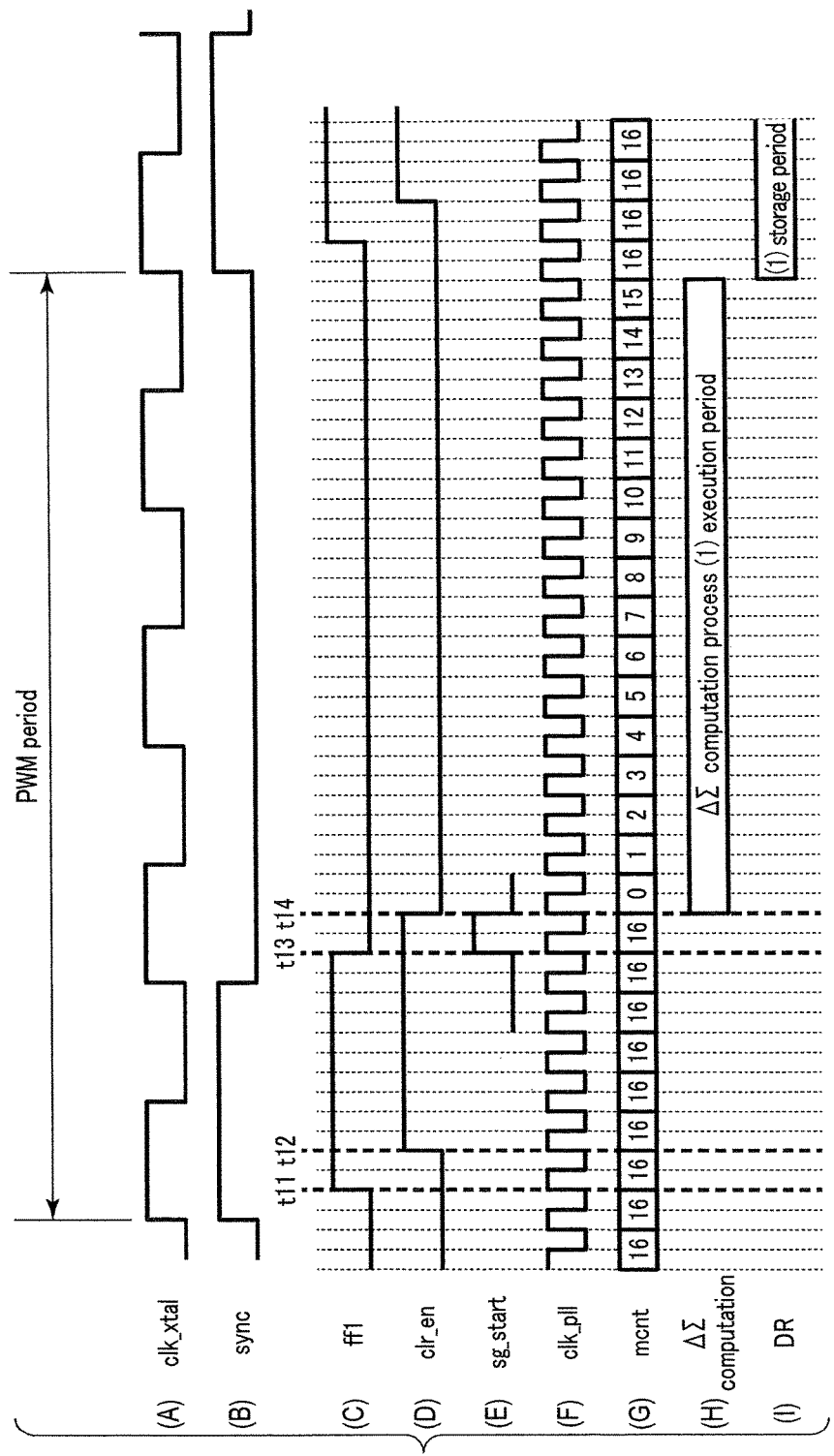
FIG. 12 is a timing chart chiefly illustrating the operation timing of the $\Delta\Sigma$ computation circuit in the case where a section corresponding to a period of the PWM signal is relatively long in the electronic musical instrument according to the embodiment.

FIG. 12 is a timing chart chiefly illustrating the operation timing of the ΔΣ computation circuit 15B in the case where a section corresponding to a period of the PWM signal is relatively long.

The signal sync shown in (B) of FIG. 12 is generated for each period of an integral multiple of the first clock clk-xtal shown in (A) of FIG. 12, as described with reference to FIG. 10. The same is true of the PWM period, and the PWM period is a period of an integral multiple of the first clock clk-xtal.

The signal sync supports the start of computation in the ΔΣ computation circuit 15B. The ΔΣ computation performed by the ΔΣ computation circuit 15B is based upon the clock clk-pll shown in (F) of FIG. 12, whose speed is higher than that of the clock clk-xtal and which is asynchronous with the clock clk-xtal.

In the ΔΣ computation circuit 15B that has received the signal sync, the flip-flops 33 and 34 of two stages to achieve a synchronous operation generate a delayed signal ff1 as shown in (C) of FIG. 12 and a further delayed signal clr_en as shown in (D) of FIG. 12.

In response to the signal clr_en, as a clear enable signal of the m counter 61A that is a counter for a basic operation of the ΔΣ computation, whose count values are shown in (G) of FIG. 12, the m counter 61A is reset to "0" with timing t14 in FIG. 12. After that, the ΔΣ computation is started and executed as described with reference to FIGS. 8 and 9. In FIG. 12, (H) represents the execution period of the ΔΣ computation.

Furthermore, as shown in (I) of FIG. 12, a storage period is set in the register (DR) 63 provided in the output stage of the ΔΣ computation circuit 15B. During this period, the computation circuit stands by to start the next ΔΣ computation.

During the above period, the register (PR) 84 alongside the output circuit 15C receives a result of the computation. Since setup time Ts and hold time Th are sufficient, data can be transferred without any synchronous operation.

The setup time Ts and hold time Th depend upon the relationship in frequency between the clock clk-xtal and clock clk-pll. The hold time of the register (DR) 63 to hold the computation result is relatively long, and the frequency of each of the clock clk-xtal and clock clk-pll can be selected within a broad range in which the setup time Ts and hold time Th are compensated.

Figure 13:
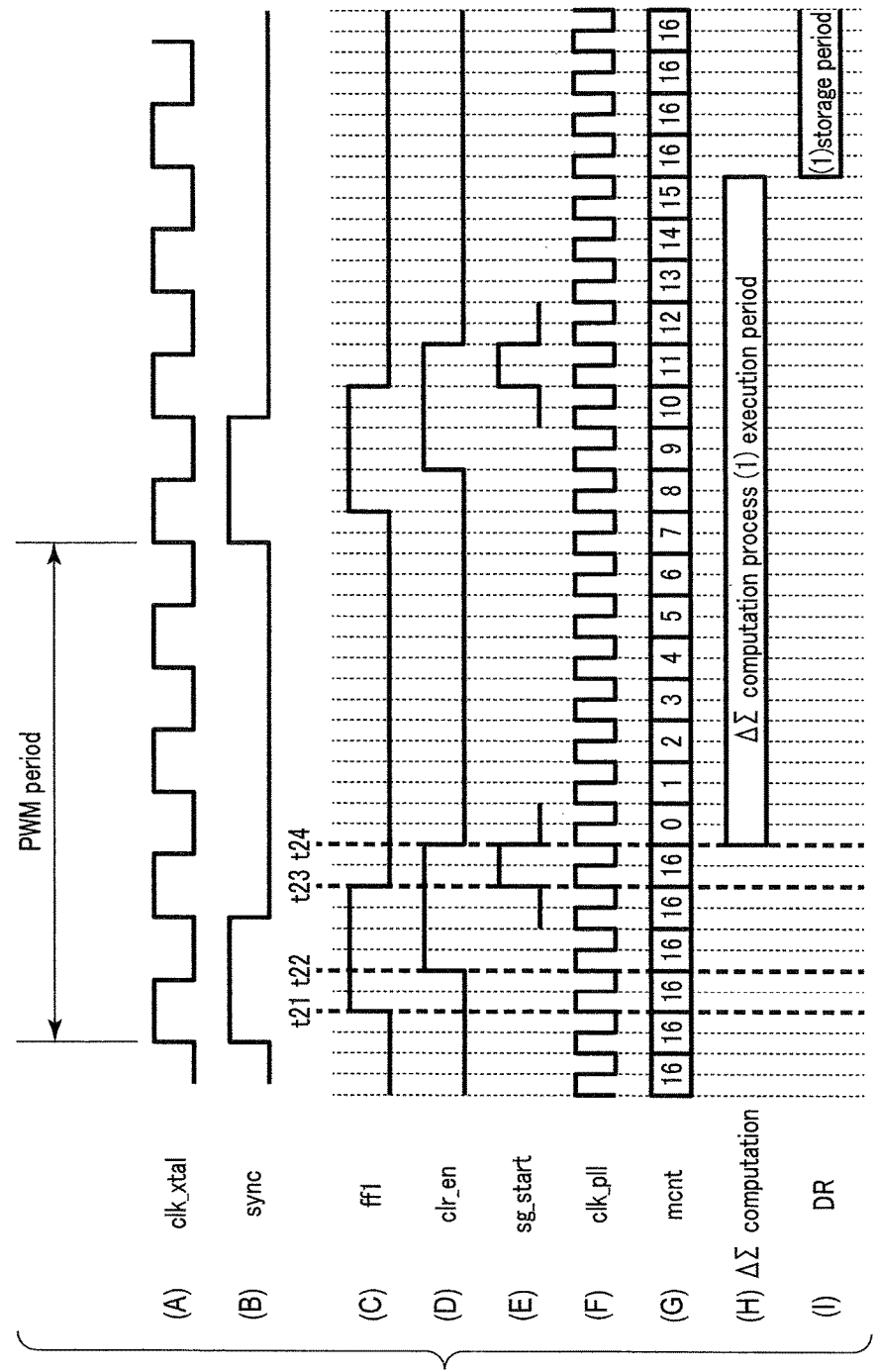
FIG. 13 is a timing chart chiefly illustrating the operation timing of the ΔΣ computation circuit in the case where a section corresponding to a period of the PWM signal is relatively short in the electronic musical instrument according to the embodiment.

FIG. 13 is a timing chart chiefly illustrating the operation timing of the ΔΣ computation circuit 15B in the case where a section corresponding to a period of the PWM signal is relatively short. In this case, the period of the clock clk-xtal is relatively shorter than that of the clock clk-pll as shown in (A) of FIG. 13, with the result that a signal sync is generated as shown in (B) of FIG. 13 regardless of the ΔΣ computation.

However, when the count value of the m counter 61A is "0" to "15" during the execution of the ΔΣ computation, a signal sync is not received. Thus, the ΔΣ computation is executed continuously without interruption.

The result of the ΔΣ computation is held in the register (DR) 63 as shown in (I) of FIG. 13. In this case, too, the period Fsp is short. In the output (PWM) circuit 15C, therefore, the register (PR) 84 reads the same computation result twice in response to a signal sync input in a short period and hold it, and the same PWM signal may be generated, but no performance problem will not occur.

Specifically, except that the setup time Ts and hold time Th are both extremely short and except for the multiple of the frequency of the clock clk-xtal and clock clk-pll, the ratio of the frequency of clock clk-xtal to that of clock clk-pll can be selected within a wide range, and the present embodiment is adaptable to continuous modulation.

FIG. 14 is a timing chart showing ΔΣ computation of the ΔΣ computation circuit 15B, transmission/receipt of computation results between the ΔΣ computation circuit 15B and the output circuit 15C, and the PWM signal output timing of the output circuit 15C, which corresponds to FIGS. 12 and 13.

As shown in (A) of FIG. 14, the ΔΣ computation circuit 15B executes first ΔΣ computation until timing t32 after first wait time a from timing t31 of signal sync to signal clr_en.

As shown in (B) of FIG. 14, the register (DR) 63 on the output side of the ΔΣ computation circuit 15B holds a result of the ΔΣ computation with a sufficient time duration including first wait time b from timing t32 to timing t33 of the next signal sync and delayed time from timing t33 to the start of the subsequent ΔΣ computation and also including the execution of second ΔΣ computation.

Therefore, as shown in (C) of FIG. 14, the output circuit 15C can output a PWM signal, converts it into an analog signal through a low-pass filter in the subsequent stage and outputs the analog signal, using the PWM period effectively.

FIG. 15 shows variations of a one-sampling period Fsd of digital audio data output from the sound source circuit 14 at a stage precedent to the ΔΣ modulator 15.

Consider that fluctuations F occur as shown in FIG. 15 when one-sampling period Fsd of digital audio data is long ((A) of FIG. 15), normal ((B) of FIG. 15) and short ((C) of FIG. 15) due to the SSCG of the Pll, jitters and the like.

The ΔΣ computation circuit 15B and the output circuit 15C of the ΔΣ modulator 15 are performed at the period of the ΔΣ computation shown in (D) of FIG. 15, namely the PWM period based upon the clock clk-xtal whose period does not vary. As described above, ΔΣ computation results are transferred between the ΔΣ computation circuit 15B and the output circuit 15C to absorbing variations due to the fluctuations F, with the result that D/A conversion can be made without degrading output precision.

As described in detail, according to the present embodiment, a process can be performed in whatever frequency combination of a first clock of a crystal oscillator as a reference and a second clock of a PLL whose frequency is higher than that of the first clock.

In the foregoing embodiment, since the PLL 17 uses a spread spectrum clock generator (SSCG), radiated electromagnetic noise can greatly be reduced.

Furthermore, in the foregoing embodiment, the differential amplifier amplifies an analog signal generated from a PWM signal in the output stage. Thus, noise can be reduced by eliminating bipolar noise that is caused in general digital processing and in an interconnect transmission path.

If a sound source using a D/A converted as described above is built in various electronic instruments and information processing devices such as a personal computer, high-quality sound in which both a wide dynamic range and low noise are mutually compatible can be generated.

Specific embodiments of the present invention were described above, but the present invention is not limited to the above embodiments, and modifications, improvements, and the like within the scope of the aims of the present invention are included in the present invention. It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A digital-to-analog converter that converts digital audio data of a music sound represented by an input digital signal into an analog signal, the digital-to-analog converter being configured to perform:
   a signal output process to output a control signal at a second period, the second period being equal to an integral multiple of a first period in a first clock signal;
   a count process to count a second clock signal whose clock frequency is higher than that of the first clock signal, and to store a count value;
   a determination process to determine whether ΔΣ computation is under execution with respect to the digital audio data, in accordance with the count value stored by the count process;
   a ΔΣ computation process to start the ΔΣ computation based upon the second clock signal with respect to the digital audio data if it is determined in the determination process that the ΔΣ computation is not under execution when the control signal is outputted by the signal output process;
   a control process to inhibit the ΔΣ computation based upon the second clock signal from being started with respect to the digital audio data until it is determined in the determination process that the ΔΣ computation is not under execution after it is determined in the determination process that the ΔΣ computation is under execution; and
   an output process to convert a computation result of the ΔΣ computation process into an analog signal and to output the analog signal.

2. An electronic musical instrument, comprising:
   a performance operation device;
   a digital-to-analog converter that converts digital audio data of a music sound represented by an input digital signal into an analog signal; and
   a speaker that outputs the music sound converted into the analog signal by the digital-to-analog converter in accordance with an operation of the performance operation device,
   the digital-to-analog converter being configured to perform:
   a signal output process to output a control signal at a second period, the second period being equal to an integral multiple of a first period in a first clock signal;
   a count process to count a second clock signal whose clock frequency is higher than that of the first clock signal, and to store a count value;
   a determination process to determine whether ΔΣ computation is under execution with respect to the digital audio data, in accordance with the count value stored by the count process;
   a ΔΣ computation process to start the ΔΣ computation based upon the second clock signal with respect to the digital audio data if it is determined in the determination process that the ΔΣ computation is not under execution when the control signal is outputted by the signal output process;
   a control process to inhibit the ΔΣ computation based upon the second clock signal from being started with respect to the digital audio data until it is determined in the determination process that the ΔΣ computation is not under execution after it is determined in the determination process that the ΔΣ computation is under execution; and
   an output process to convert a computation result of the ΔΣ computation process into an analog signal and to output the analog signal.

3. The electronic musical instrument of claim 2, wherein the second clock signal is generated by a phase-locked loop with a spread spectrum clock generator.

4. The electronic musical instrument of claim 2, further comprising an amplifier configured to perform an amplification process to amplify a continuous analog amount differentially in the analog signal output in the output process.

5. An information processing device, comprising:
   a digital-to-analog converter that converts digital audio data of a music sound represented by an input digital signal into an analog signal,
   the digital-to-analog converter being configured to perform:
   a signal output process to output a control signal at a second period, the second period being equal to an integral multiple of a first period in a first clock signal;
   a count process to count a second clock signal whose clock frequency is higher than that of the first clock signal, and to store a count value;
   a determination process to determine whether ΔΣ computation is under execution with respect to the digital audio data, in accordance with the count value stored by the count process;
   a ΔΣ computation process to start the ΔΣ computation based upon the second clock signal with respect to the digital audio data if it is determined in the determination process that the ΔΣ computation is not under execution when the control signal is outputted by the signal output process;

a control process to inhibit the ΔΣ computation based upon the second clock signal from being started with respect to the digital audio data until it is determined in the determination process that the ΔΣ computation is not under execution after it is determined in the determination process that the ΔΣ computation is under execution; and an output process to convert a computation result of the ΔΣ computation process into an analog signal and to output the analog signal.

6. The information processing device of claim 5, wherein the second clock signal is generated by a phase-locked loop with a spread spectrum clock generator.

7. The information processing device of claim 5, further comprising an amplifier that performs an amplification process to amplify a continuous analog amount differentially in the analog signal output in the output process.

8. A method of causing a computer of an electronic musical instrument including a performance operation device, a digital-to-analog converter that converts digital audio data of a music sound represented by an input digital signal into an analog signal, and a speaker that outputs the music sound converted into the analog signal by the digital-to-analog converter in accordance with an operation of the performance operation device, to perform:

a signal output process to output a control signal at a second period, the second period being equal to an integral multiple of a first period in a first clock signal;

a count process to count a second clock signal whose clock frequency is higher than that of the first clock signal, and to store a count value;

a determination process to determine whether ΔΣ computation is under execution with respect to the digital audio data, in accordance with the count value stored by the count process;

a ΔΣ computation process to start the ΔΣ computation based upon the second clock signal with respect to the digital audio data if it is determined in the determination process that the ΔΣ computation is not under execution when the control signal is outputted by the signal output process;

a control process to inhibit the ΔΣ computation based upon the second clock signal from being started with respect to the digital audio data until it is determined in the determination process that the ΔΣ computation is not under execution after it is determined in the determination process that the ΔΣ computation is under execution; and an output process to convert a computation result of the ΔΣ computation process into an analog signal and to output the analog signal.

* * * * *